(12) United States Patent
Xie

(10) Patent No.: US 9,881,941 B2
(45) Date of Patent: Jan. 30, 2018

(54) ARRAY SUBSTRATE AND METHOD FOR MANUFACTURING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Zhenyu Xie, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/498,282

(22) Filed: Sep. 26, 2014

(65) Prior Publication Data

US 2015/0263042 A1 Sep. 17, 2015

(30) Foreign Application Priority Data

Mar. 17, 2014 (CN) .......................... 2014 1 0098777

(51) Int. Cl.
*H01L 27/12* (2006.01)
(52) U.S. Cl.
CPC ........ *H01L 27/124* (2013.01); *H01L 27/1248* (2013.01); *H01L 27/1259* (2013.01)
(58) Field of Classification Search
CPC ............... H01L 27/124; H01L 27/1288; H01L 29/7869; H01L 27/1225; H01L 27/1248
See application file for complete search history.

(56) References Cited

U.S. PATENT DOCUMENTS

2001/0046016 A1  11/2001  Park et al.
2005/0078264 A1*  4/2005  Yoo ...................... G02F 1/1345
                                                    349/152
2011/0177639 A1  7/2011  Kang et al.

FOREIGN PATENT DOCUMENTS

CN            1607442 A     4/2005
CN            1614487 A     5/2005
                    (Continued)

OTHER PUBLICATIONS

Notification of the First Office Action dated Feb. 25, 2016 corresponding to Chinese application No. 201410098777.6.

*Primary Examiner* — Tony Tran
(74) *Attorney, Agent, or Firm* — Nath, Goldberg & Meyer; Joshua B. Goldberg

(57) ABSTRACT

The invention provides a method for manufacturing an array substrate which comprises a gate driving circuit including a plurality of thin film transistors and connection gate lines each connected between gates of two adjacent thin film transistors, the method comprises steps of: step S1, forming a pattern including the gates of the thin film transistors and the connection gate lines on a base; step S2, forming a gate insulation layer above the pattern including the gates of the thin film transistors and the connection gate lines; step S3, forming a pattern including a gate line protecting layer on the gate insulation layer, wherein the gate line protecting layer is above the connection gate lines; and step S4, forming a pattern including the sources and drains of the thin film transistors. The invention also provides an array substrate which is manufactured by above method, and a display device comprising the same.

10 Claims, 4 Drawing Sheets

(56) References Cited

FOREIGN PATENT DOCUMENTS

| CN | 101330062 A | 12/2008 |
|---|---|---|
| CN | 1614492 A | 5/2011 |

* cited by examiner

Drawings:

ARRAY SUBSTRATE AND METHOD FOR MANUFACTURING THE SAME, AND DISPLAY DEVICE

FIELD OF THE INVENTION

The invention relates to the field of display technology, in particular, to an array substrate and a method for manufacturing the same, and a display device comprising the array substrate.

BACKGROUND OF THE INVENTION

A liquid crystal display panel may generally include an array substrate, a color filter substrate and a gate driving circuit. The gate driving circuit supplies scanning signals to thin film transistors on the array substrate. To enhance integration of the display panel, the gate driving circuit may be integrated into the array substrate.

The gate driving circuit 1 integrated into the array substrate comprises a plurality of thin film transistors and connection gate lines each of which is connected between two adjacent thin film transistors, as shown in FIG. 1 (FIG. 1 shows thin film transistors T1, T2, T3 and T4 in the gate driving circuit), FIG. 2 shows the connection relationship between two adjacent thin film transistors, and as shown in the FIG. 2, a connection gate line 12 is connected between two adjacent thin film transistors 10.

FIG. 3 shows a flowchart of a method for forming a pattern of the active layer of the thin film transistor in the gate driving circuit and forming a pattern of a source and a drain of the thin film transistor in the gate driving circuit when an array substrate is manufactured in the prior art. After gates 11, a connection gate line 12, a gate insulation layer 20 and a semiconductor layer 30 of the thin film transistors are formed, the method for manufacturing the array substrate further comprises steps of: forming a photoresist layer 40 (FIG. 3a)→performing an exposure and a development (FIG. 3a)→etching the semiconductor layer, so that the active layers of two adjacent thin film transistors are separated from each other; then etching the gate insulation layer (3c)→ashing the photoresist layer above the remaining semiconductor layer (3d)→etching so as to form an active layer 31, and peeling off the remaining photoresist (3e)→forming a source and drain metal layer 50, and then forming a photoresist layer thereon; performing an exposure and a development (3f)→etching so as to form the sources 51 and drains 52, and peeling off the remaining photoresist (3g).

It can be seen from FIG. 3a, the part of the photoresist layer above the connection gate line 12 is thinner than the remaining photoresist layer. Thus, in the FIG. 3b, after exposure, there is no photoresist layer remaining above the connection gate line 12. Therefore, as shown in FIG. 3g, when the source and drain metal layer is etched using etchant to form the source and the drain, the connection gate line is likely to be etched away.

Therefore, how to protect the connection gate line connected between two adjacent thin film transistors from being damaged when the source and drain metal layer is etched has been a technical problem to be solved.

STEP SUMMARY OF THE INVENTION

An object of the invention is to provide a method for manufacturing an array substrate, an array substrate manufactured using the method, a display panel including the array substrate and a display device including the display panel. The method can prevent the connection gate line from being etched away when the source and drain metal layer is etched.

To achieve the object, a first aspect of the invention provides a method for manufacturing an array substrate, wherein the array substrate comprises a gate driving circuit including a plurality of thin film transistors and connection gate lines each of which is connected between gates of two adjacent thin film transistors, the method comprises:

step S1, forming a pattern including the gates of the thin film transistors and the connection gate lines on a base;

step S2, forming a gate insulation layer above the pattern including the gates of the thin film transistors and the connection gate lines;

step S3, forming a pattern including a gate line protecting layer on the gate insulation layer, wherein the gate line protecting layer is above the connection gate lines; and step S4, forming a pattern including the sources and drains of the thin film transistors.

Preferably, the step S3 further comprises: forming a pattern of an active layer of the thin film transistors on the gate insulation layer while forming the pattern including the gate line protecting layer, wherein the material of the gate line protecting layer is the same as that of the active layer of the thin film transistors; and the step S4 further comprises: forming a pattern including the sources and the drains of the thin film transistors above the active layer.

Preferably, the step S3 comprises:

step S31, forming a semiconductor layer above the gate insulation layer;

step S32, coating a photoresist layer on the semiconductor layer; and step S33, forming a pattern including the active layer and the gate line protecting layer through photolithography.

Preferably, the step S33 comprises:

step S33a, exposing portions of the photoresist layer other than those corresponding to the thin film transistors and the gate line protecting layer, so that the exposed and developed photoresist layer forms a thin-film-transistor part corresponding to the thin film transistors and a gate-line-protecting-layer part corresponding to the gate line protecting layer, wherein both the thickness of the thin-film-transistor part and that of the gate-line-protecting-layer part are larger than that of portions of the photoresist layer other than the thin-film-transistor part and the gate-line-protecting-layer part; and step S33b, performing etching using etchant so as to form a pattern including the active layer and the gate line protecting layer.

Preferably, the step S33a further comprises: performing an exposure on a portion of the photoresist layer corresponding to at least one end of the gate-line-protecting-layer part, so that after exposure and development, an interval part is formed at the at least one end of the gate line protecting part and the thickness of the interval part is smaller than that of the gate line protecting part.

Preferably, both ends of the gate-line-protecting-layer part are formed with interval parts.

Preferably, the interval part has a length ranging from 3.0 µm to 5.5 µm.

Preferably, the interval part has a length ranging from 4.0 µm to 5.0 µm.

Preferably, the thickness of the interval part is ¼ to ½ of the thickness of the gate-line-protecting-layer part.

A second aspect of the invention provides an array substrate comprising a gate driving circuit, the gate driving circuit comprises a plurality of thin film transistors and connection gate lines each of which is connected between gates of two adjacent thin film transistors, wherein the array substrate further comprises a gate line protecting layer provided on a gate insulation layer of the thin film transistors and corresponding to the connection gate lines.

Preferably, the gate line protecting layer and the active layer of the thin film transistors are provided in the same layer and made of the same material.

Preferably, the gate line protecting layer is separated from the active layer of the thin film transistor by a predetermined interval.

Preferably, the predetermined interval has a length ranging from 3.0 μm to 5.5 μm. Further preferably, the predetermined interval has a length ranging from 4.0 μm to 5.0 μm.

A third aspect of the invention provides a display device comprising the above array substrate.

In the method for manufacturing the array substrate, the gate line protecting layer formed in step S3 is above the connection gate lines and on the gate insulation layer, when the pattern including the sources and the drains of the thin film transistors are formed using the etching process, the gate line protecting layer may protect the gate insulation layer above the connection gate lines from being etched away by etchant, so as to guarantee the integrity of the connection gate lines.

BRIEF DESCRIPTION OF THE DRAWINGS

Drawings are used to provide further understanding of the invention, construct a part of the description, and are used to explain the invention in conjunction with the specific embodiments, but the invention is not limited thereto, wherein.

DETAILED DESCRIPTION OF THE EMBODIMENTS

The embodiments of the invention will be explained in detail in conjunction with drawings below. It should be understood that, the embodiments illustrated herein are simply used to explain the invention, but not to limit.

As shown in FIG. 4 to FIG. 10, the invention provides a method for manufacturing an array substrate, the array substrate comprises a gate driving circuit including a plurality of thin film transistors and connection gate lines each of which is connected between two adjacent thin film transistors, the method comprises:

step S1, forming a pattern including the gates 11 of the thin film transistors and the connection gate line 12;

step S2, forming a gate insulation layer 20 above the pattern including the gates 11 of the thin film transistors and the connection gate line 12 formed in the step S1;

step S3, forming a pattern including a gate line protecting layer 60 above the gate insulation layer 20, wherein the gate line protecting layer 60 is above the connection gate line 12; and step S4, forming a pattern including the sources and drains of the thin film transistors.

Figure 8:
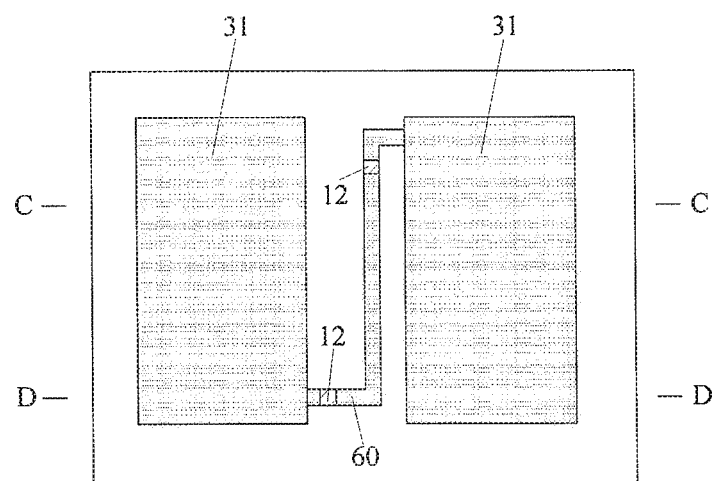
FIG. 8 is a top view of the array substrate subjected to a step S3 when manufacturing the array substrate using the method in the invention.
Figure 9:
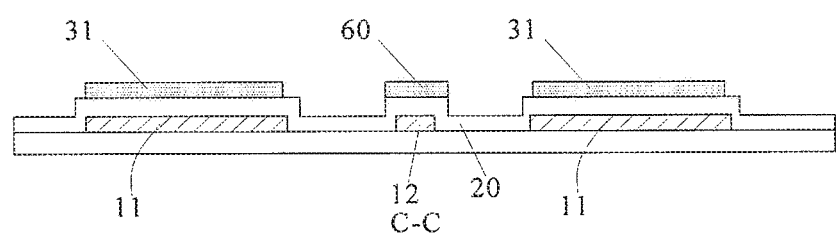
FIG. 9 is a cross-sectional diagram of the array substrate in FIG. 8 taken along line C-C.

As shown in FIG. 8 and FIG. 9, the gate line protecting layer 60 formed in the step S3 is above the connection gate line 12 and on the gate insulation layer 20, so when forming the pattern including the sources and the drains of the thin film transistors using the etching process, the gate line protecting layer 60 may protect the gate insulation layer 20 above the connection gate line 12 from being etched away by etchant, so as to guarantee the integrity of the connection gate line 12.

The configurations of the thin film transistors in the gate driving circuit are well known by a person skilled in the art, and will not be described herein. Also, in addition to the gate driving circuit, the array substrate comprises a pixel circuit.

In the invention, a material of the gate line protecting layer 60 is not specially specified, so long as the gate line protecting layer 60 is above the connection gate line 12 and prevents the connection gate line 12 from being corroded due to the gate insulation layer 20 being etched away in the step S4.

For example, the step S3 may be a separated patterning step, the gate line protecting layer may be formed in the step S3, and an active layer of the thin film transistors may be formed between the step S3 and the step S4, or the active layers of the thin film transistors may be formed between the step S2 and the step S3.

In order to simplify the manufacturing process, preferably, as shown in FIG. 8 and FIG. 9, the active layer 31 of the thin film transistor and the gate line protecting layer 60 may be formed simultaneously in the step S3. A pattern including the active layer 31 of the thin film transistor and the gate line protecting layer 60 may be formed through a patterning process. There is no limitation to the patterning process in the invention, for example, the active layer of the thin film transistor and the gate line protecting layer may be formed through printing, transferring, spraying and the like.

Figure 1:
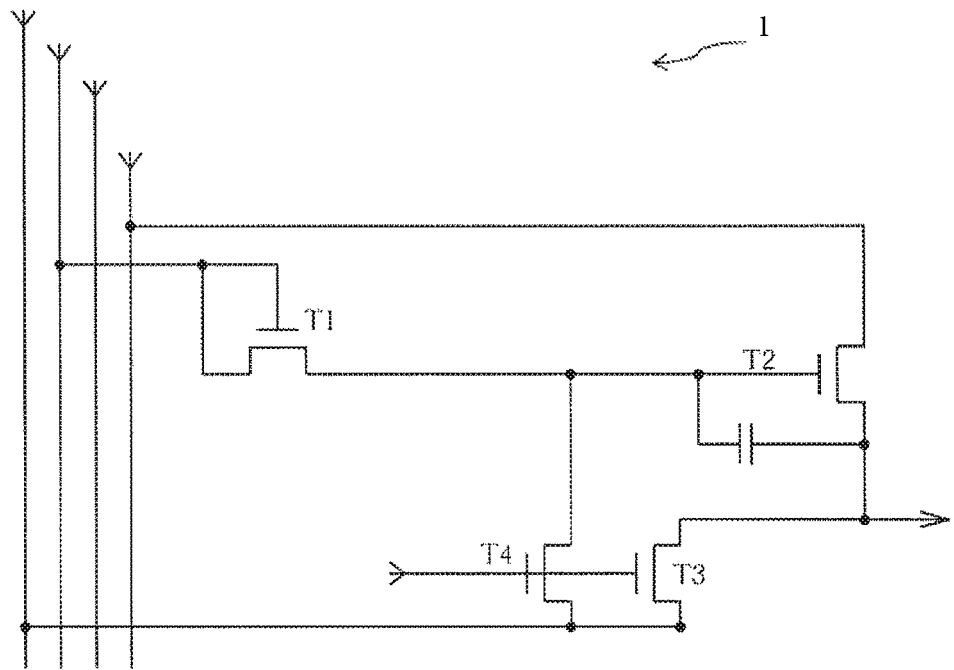
FIG. 1 is a circuit diagram of a gate driving circuit.
Figure 2:
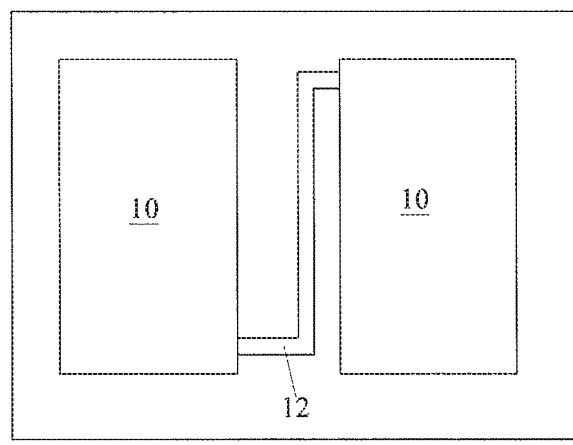
FIG. 2 is a diagram illustrating a connection between two adjacent thin film transistors.
Figures 3A, 3B, 3C, 3D, 3E, 3F, 3G:
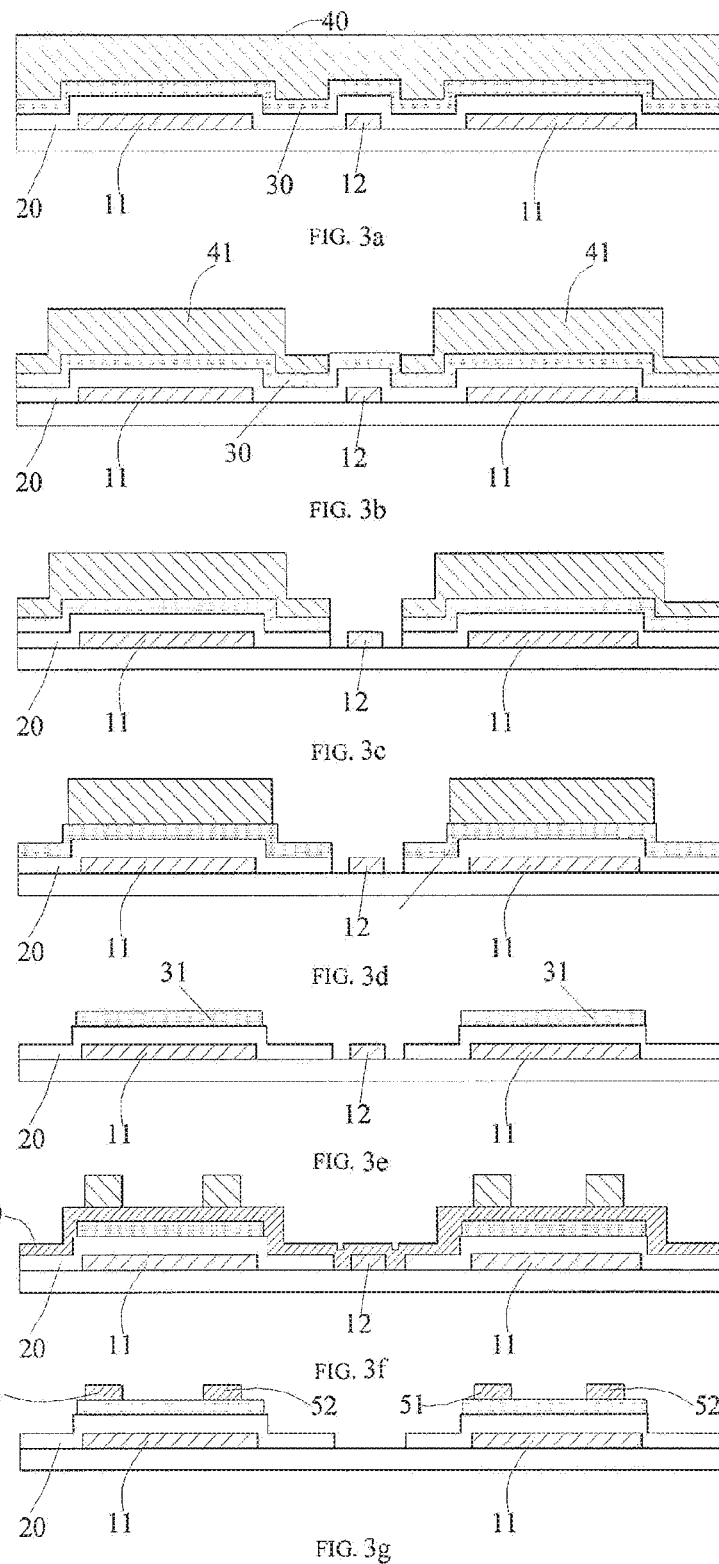
FIG. 3A-G is a diagram illustrating processes of manufacturing an array substrate including the gate driving circuit in FIG. 1.
Figure 4:
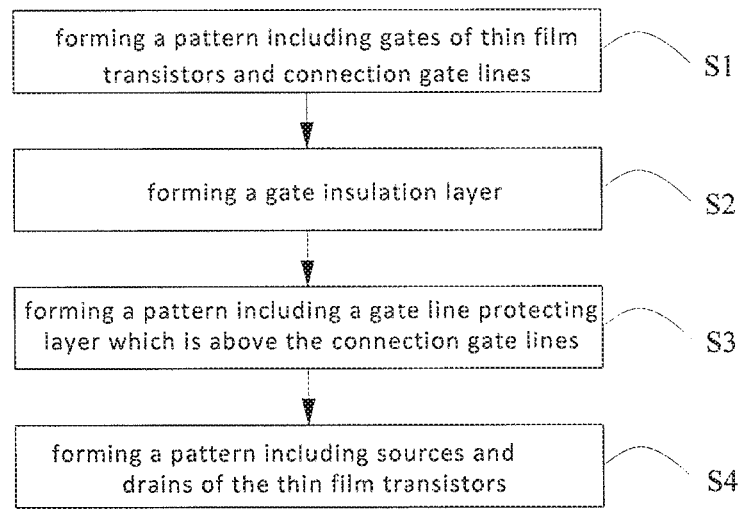
FIG. 4 is a flowchart of a method for manufacturing the array substrate in the invention.
Figure 5:
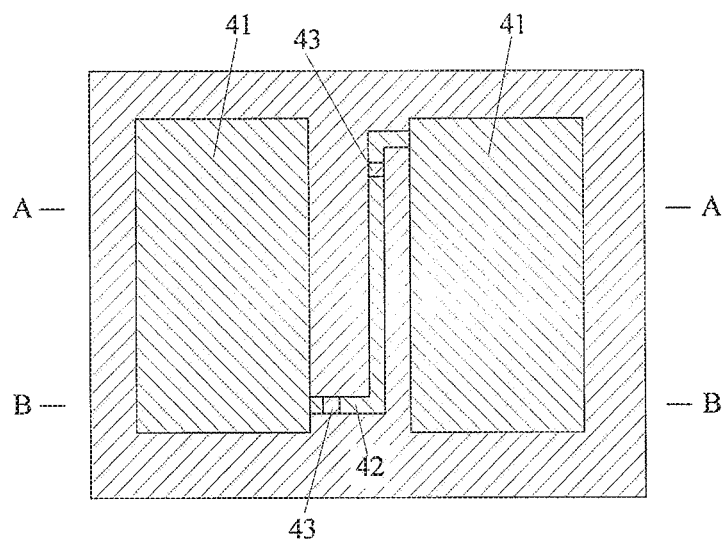
FIG. 5 is a top view of the array substrate subjected to a step S33a when manufacturing the array substrate using the method in the invention.
Figure 6:
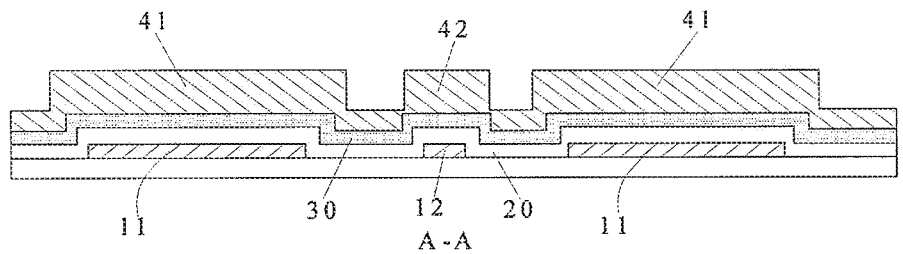
FIG. 6 is a cross-sectional diagram of the array substrate in FIG. 5 taken along line A-A.
Figure 7:
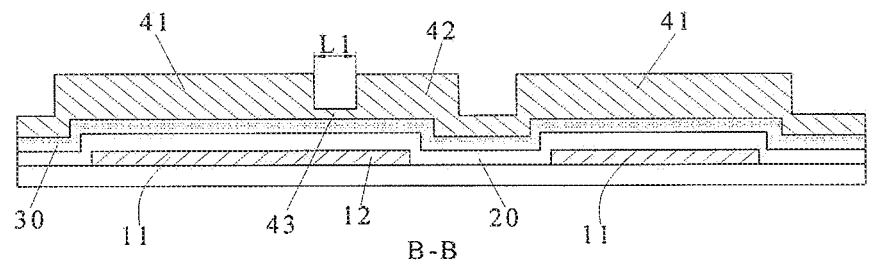
FIG. 7 is a cross-sectional diagram of the array substrate in FIG. 5 taken along line B-B.

As an alternative, the active layer 31 of the thin film transistor and the gate line protecting layer 60 may be formed through the conventional photolithography process. As shown in FIG. 5 to FIG. 7, the step S3 may comprises:

step S31, forming a semiconductor layer 30 above the gate insulation layer;

step S32, coating a photoresist layer on the semiconductor layer 30; and step S33, forming a pattern including the active layer 31 and the gate line protecting layer 60 through photolithography (see FIG. 9).

In the step S31, the semiconductor layer 30 may be formed on the base through deposition, evaporation or the like.

Photolithography performed in the step S33 includes exposure, development, etching and peeling off the photoresist and the like.

In order to prevent the photoresist above the connection gate line 12 from being etched away completely in the photolithography, preferably, the step S33 may comprises following steps of:

step S33*a*, exposing portions of the photoresist layer other than those corresponding to the thin film transistors and the gate line protecting layer, so that the exposed and developed photoresist layer forms a thin-film-transistor part 41 corresponding to the thin film transistors and a gate-line-protecting-layer part 42 corresponding to the gate line protecting layer, wherein both the thickness of the thin-film-transistor part 41 and that of the gate-line-protecting-layer part 42 are larger than that of portions of the photoresist layer other than the thin-film-transistor part and the gate-line-protecting-layer part, as shown in FIG. 6 and FIG. 7.

Step S33*b*, performing etching using etchant so as to form a pattern including the active layer and the gate line protecting layer. The step S33*a* is an exposure and development process, and after the exposure and development process, both the thickness of the thin-film-transistor part 41 and that of the gate-line-protecting-layer part 42 are larger than that of portions of the photoresist layer other than the thin-film-transistor part 41 and the gate-line-protecting-layer part 42. Generally, the thickness of portions of the photoresist layer other than the thin-film-transistor part 41 and the gate-line-protecting-layer part 42 is ¼ to ½ of the thickness of the thin-film-transistor part 41 and/or that of the gate-line-protecting-layer part 42.

As both the thickness of the thin-film-transistor part 41 and that of the gate-line-protecting-layer part 42 are larger than that of portions of the photoresist layer other than the thin-film-transistor part 41 and the gate-line-protecting-layer part 42, when performing etching using etchant, the exposed portions of the photoresist layer may be etched away without making the thin-film-transistor part 41 and the gate-line-protecting-layer part 42 corroded.

Specifically, the thin-film-transistor part of the photoresist layer refers to a region corresponding to the pattern of the active layer of the thin film transistor, the gate-line-protecting-layer part of the photoresist layer refers to a region corresponding to the gate line protecting layer, the thickness of these regions of the photoresist layer are larger than that of other regions, thus the semiconductor layer in these regions can not be etched, and the pattern including the active layer 31 of the thin film transistor and the gate line protecting layer 60 may be further formed.

In order to ensure that the active layers of two adjacent thin film transistors are separated from each other, preferably, as shown in FIG. 7, the step S33*a* further comprises a step of performing an exposure on a portion of the photoresist layer corresponding to at least one end of the gate-line-protecting-layer part, so that after exposure and development, an interval part 43 is formed at the at least one end of the gate-line-protecting-layer part, wherein the thickness of the interval part 43 is smaller than that of the gate-line-protecting-layer part 42.

The interval part 43 formed by exposure and development has a small thickness, therefore, when the pattern including the active layer and the gate line protecting layer is formed by using etchant, at least a part of the semiconductor layer above the connection gate line can be etched away, thus the active layers of two adjacent thin film transistors can be separated.

Figure 10:
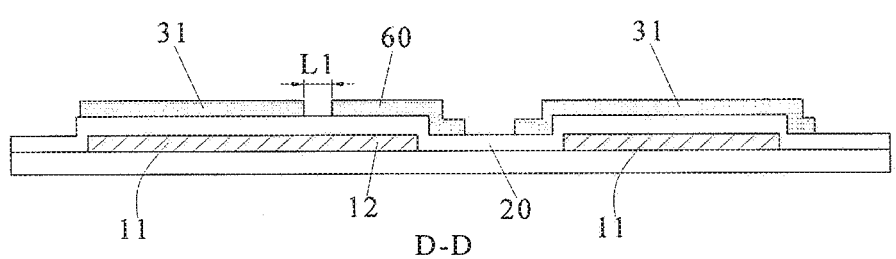
FIG. 10 is a cross-sectional diagram of the array substrate in FIG. 8 taken along line D-D.

Further preferably, as shown in FIG. 5, interval parts 43 are provided at both ends of the gate line protecting part 42, thus it can be ensured that the active layers of two adjacent thin film transistors can break by etching using etchant. As shown in FIG. 8 and FIG. 10, after the etching using etchant, a part of the semiconductor layer corresponding to the interval part can be removed, therefore, the active layers of two adjacent thin film transistors can be separated.

As shown in FIG. 7, the interval part 43 and the gate line protecting part 42 are integrally formed, thus the width of the interval part 43 (wherein the width direction is vertical to the paper) may be the same as that of the gate line protecting part. The length L1 of the interval part 43 should satisfy following conditions: not only ensuring that the active layers of two adjacent thin film transistors can be separated, but also preventing the semiconductor layer above the connection gate line from being etched away, therefore, preferably, the interval part 43 has a length ranging from 3.0 μm to 5.5 μm, and the width of the interval part 43 is the same as that of the gate line protecting part. As the length of the interval part 43 is relatively small, therefore, when the semiconductor layer is etched by using etchant, a small amount of etchant enters into the interval part 43, thereby a corresponding part of the semiconductor layer can be etched away, and etchant cannot permeate downwards to corrode the connection gate line.

Further preferably, the interval part has a length ranging from 4.0 μm to 5.0 μm.

Further preferably, the thickness of the interval part 43 is ¼ to ½ of the thickness of the gate line protecting part 42.

The second aspect of the invention provides an array substrate manufactured by the above manufacturing method, that is, the array substrate comprises a gate driving circuit, the gate driving circuit comprises a plurality of thin film transistors and connection gate lines each of which is connected between gates of two adjacent thin film transistors, wherein the array substrate further comprises a gate line protecting layer provided on a gate insulation layer of the thin film transistors and corresponding to the connection gate lines.

As the gate line protecting layer is on the gate insulation layer of the thin film transistor, when a pattern including the active layer is formed, the gate insulation layer below the gate line protecting layer will not be easily etched away, therefore the continuity of the connection gate line can be ensured.

As above, in order to simplify the manufacturing process, the active layer of the thin film transistor and the gate line protecting layer may be formed simultaneously in a single step. In other words, the gate line protecting layer and the active layer of the thin film transistor are provided in the same layer and made of the same material. It can be seen from the above method for manufacturing an array substrate, during forming the gate line protecting layer, the interval part 43 is formed at one or both ends of the gate line protecting part 42 corresponding to the gate line protecting layer, the thickness of the interval part 43 is smaller than that of the gate line protecting part 42 so that not only the active layer of the thin film transistor and the gate line protecting layer, but also the active layers of two adjacent thin film transistors can be separated from each other by the subsequent etching process, therefore, a predetermined interval is formed between the formed active layer of the thin film transistor and the gate line protecting layer. Also, corresponding to the width and length of the interval part 43 formed in the above manufacturing method, the length of the formed predetermined interval is preferably in a range from 3.0 μm to 5.5 μm, and further preferably in a range from 4.0 μm to 5.0 μm.

The third aspect of the invention provides a display device comprising the above array substrate. The display device may be a mobile phone, a pad, a computer display or the like.

It should be understood that, the above implementations are only used to explain the principle of the present invention, but not to limit the present invention. The person skilled in the art can make various variations and modifications without departing from the spirit and scope of the present invention, and all these variations and modifications should be considered to fall within the scope of the present invention.

The invention claimed is:

1. A method for manufacturing an array substrate, the method comprises:
   step S0, providing the array substrate comprising a gate driving circuit and a pixel circuit, the gate driving circuit is configured to generate and provide scanning signals to thin film transistors in the pixel circuit, the gate driving circuit including a plurality of thin film transistors and connection gate lines each of which is connected between gates of two adjacent thin film transistors;
   step S1, forming a pattern including gates of the thin film transistors of the gate driving circuit and the connection gate lines of the gate driving circuit on a base;
   step S2, forming a gate insulation layer above the pattern including the gates of the thin film transistors and of the gate driving circuit the connection gate lines of the gate driving circuit;
   step S3, forming a pattern including a connection gate line protecting layer on the gate insulation layer, wherein the connection gate line protecting layer is above the connection gate lines; and
   step S4, forming a pattern including the sources and drains of the thin film transistors of the gate driving circuit,
   wherein the step S3 further comprises: forming a pattern of an active layer of the thin film transistors of the gate driving circuit on the gate insulation layer while forming the pattern including the connection gate line protecting layer, wherein the material of the connection gate line protecting layer is the same as that of the active layer of the thin film transistors of the gate driving circuit,
   wherein the step S3 further comprises:
   step S31, forming a semiconductor layer above the gate insulation layer;
   step S32, coating a photoresist layer on the semiconductor layer; and
   step S33, forming a patter including the active layer and the connection gate line protecting layer through photolithography; and
   wherein the step S33 further comprises:
   step S33a, exposing portions of the photoresist layer other than those corresponding to the thin film transistors of the gate driving circuit and the connection gate line protecting layer, so that the exposed and developed photoresist layer forms a thin-film-transistor part corresponding to the thin film transistors and a connection-gate-line-protecting-layer part corresponding to the connection gate line protecting layer, wherein both the thickness of the thin-film-transistor part and that of the connection-gate-line-protecting-layer part are larger than that of portions of the photoresist layer other than the thin-film-transistor part and the connection-gate-line-protecting-layer part; and
   step S33b, performing etching using etchant so as to form a pattern including the active layer and the connection gate line protecting layer.

2. The method of claim 1, wherein
   the step S4 further comprises: forming a pattern including the sources and the drains of the thin film transistors of the gate driving circuit above the active layer.

3. The method of claim 2, wherein the step S33a further comprises: performing an exposure on a portion of the photoresist layer corresponding to at least one end of the connection-gate-line-protecting-layer part, so that after exposure and development, an interval part is formed at the at least one end of the connection-gate-line-protecting-layer part and the thickness of the interval part is smaller than that of the connection-gate-line-protecting-layer part.

4. The method of claim 3, wherein both ends of the connection-gate-line-protecting-layer part are formed with interval parts.

5. The method of claim 4, wherein the thickness of the interval part is ¼ to ½ of the thickness of the connection-gate-line-protecting-layer part.

6. The method of claim 3, wherein the interval part has a length ranging from 3.0 µm to 5.5 µm.

7. The method of claim 6, wherein the interval part has a length ranging from 4.0 µm to 5.0 µm.

8. The method of claim 7, wherein the thickness of the interval part is ¼ to ½ of the thickness of the connection-gate-line-protecting-layer part.

9. The method of claim 6, wherein the thickness of the interval part is ¼ to ½ of the thickness of the connection-gate-line-protecting-layer part.

10. The method of claim 3, wherein the thickness of the interval part is ¼ to ½ of the thickness of the connection-gate-line-protecting-layer part.

* * * * *